United States Patent [19]

Young

[11] 4,379,267

[45] Apr. 5, 1983

[54] LOW POWER DIFFERENTIAL AMPLIFIER

[75] Inventor: Ian A. Young, Farmers Branch, Tex.

[73] Assignee: Mostek Corporation, Carrollton, Tex.

[21] Appl. No.: 252,972

[22] PCT Filed: Jun. 25, 1980

[86] PCT No.: PCT/US80/00805
§ 371 Date: Jun. 25, 1980
§ 102(e) Date: Jun. 25, 1980

[87] PCT Pub. No.: WO82/00071
PCT Pub. Date: Jan. 7, 1982

[51] Int. Cl.³ .......................... H03F 3/45; H03F 3/16
[52] U.S. Cl. .................................. 330/253; 330/255; 330/257; 330/258; 330/260
[58] Field of Search ............... 330/253, 255, 257, 258, 330/260, 269; 307/448, 450

[56] References Cited

U.S. PATENT DOCUMENTS 3,959,733  5/1976  Solomon et al. .................. 330/253
4,042,839  8/1977  Araki ............................. 330/269 X
4,219,782  8/1980  Stein .............................. 330/257
4,284,959  8/1981  Heagerty et al. ................. 330/253

FOREIGN PATENT DOCUMENTS 672169   5/1952  United Kingdom.
1470565  4/1977  United Kingdom.

OTHER PUBLICATIONS

Love, "In-Phase Weak-Signal Input Circuit", *IBM Technical Disclosure Bulletin*, vol. 19, No. 12, May 1977, p. 4673.

*Primary Examiner*—James B. Mullins

[57] ABSTRACT

A differential amplifier (24, 26, 10 and 12) having a feedback network (30, 34, 32, 36 and 38) for increasing common output without loss of gain. Also disclosed is a constant current source (60), and a level shifting network (48, 50, 52 and 54) for shifting the D.C. level of the output signal to a D.C. voltage substantially near that of second current source (44). An output stage (84, 86, 90, 92 and 94) provides low output impedance, low D.C. bias power consumption and high current drive capability.

31 Claims, 3 Drawing Figures

LOW POWER DIFFERENTIAL AMPLIFIER

The invention relates to the field of integrated circuit amplifiers and, more particularly, to low power N channel MOS differential amplifier comprised of two input transconductance MOSFET's coupled to positive and negative inputs and having a single common source line in which is placed a feedback device for the purpose of amplifying the difference between an input signal impressed upon the input terminals, and for rejecting common mode input signals.

The recent developments in switched capacitor filtering techniques have caused a need to arise for a low power differential amplifier which can be used to implement precision filters monolithicaly in MOS technology without the need for trimming and which has a gain and frequency response which is substantially stable despite inadvertent production variations in the processing of individual batches of identically designed integrated circuits.

Low power consumption is extremely important in PCM filters since telephone switching systems must operate from battery back-up power. Since numerous differential amplifiers are required throughout each pulse code modulation filter, low power consumption and insensitivity to processing variations are important. That is to say that the maximum amount of gain must be achieved with a minimum number of transistors without sacrificing stability or common mode rejection.

Two important problems in differential amplifier design are differential-to-single-ended conversion without loss of gain and high common mode rejection. With respect to the differential-to-single-ended conversion, it is necessary to convert a normal differential amplifier having two inputs and two outputs to an amplifier having two inputs and one output without losing half of the gain of the amplifier. With respect to common mode rejection, it is desirable to have zero output voltage when the two inputs change by the same amount in the same polarity and at the same time.

Operational amplifiers are used very frequently as building blocks for other electronic systems. They are used primarily with externally applied feedback to perform functions such as providing a stable gain block, integration and filtering. The ideal operational amplifier is a voltage controlled voltage source having two input terminals and a single output terminal. Ideally, an operational amplifier has: a large gain; zero output voltage when the difference between the input voltages is zero; zero input current; zero output resistance to maximize gain; no frequency dependence, no temperature dependence, no distortion, no processing dependence; and low power consumption.

Typically, an operational amplifier is constructed of an input differential amplifier employing a differential-to-single-ended conversion circuit to allow the output signal to be taken from only one output terminal, and employs a common mode feedback loop to increase common mode rejection. Following the input differential amplifier, a level shift stage is used to shift the D.C. component of the output signal down to near zero relative to analog ground so that the output voltage will be near zero for zero input voltage. Finally, an output stage having little gain is used to lower the output resistance of the operational amplifier and to increase the current drive capability since the input and gain stages seldom can supply the output current requirement and generally have high output impedances.

One way of doing the differential-to-single-ended conversion is by simply taking the output signal from only one of the two output nodes of the differential amplifier. The disadvantages of this method are that the gain is only half that which would be obtained if a differential output were used, and the output signal contains not only a differential component but also a common mode component.

In accordance with the principles of the instant invention, an operational amplifier is described which utilizes simple circuitry compatible with N channel MOSFET processing to achieve temperature and processing variation tolerant gain and frequency response and which can adequately drive most common types of loads in a stable fashion with low power consumption and high common mode rejection. A simple, broadband feedback network is disclosed which simultaneously makes the differential-to-single-ended conversion and increases common mode rejection.

The preferred of many embodiments of the invention is described in detail below with reference to the drawings which illustrate only one specific embodiment, in which.

Figure 1:
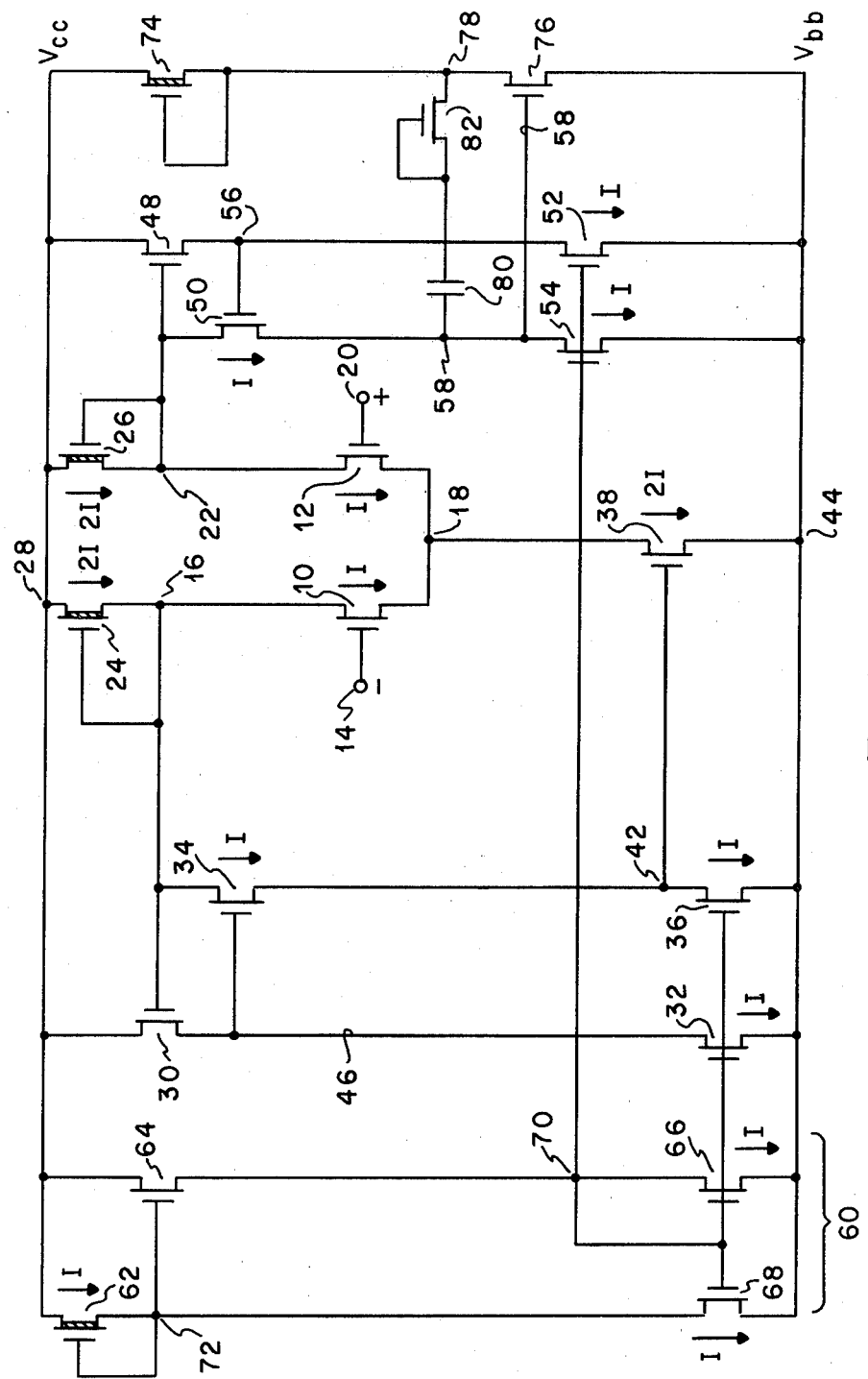
FIG. 1 is a schematic diagram of the operational amplifier without the output stage for use where the impedance of the load is known and large current drive capability is not as important.

FIG. 1 shows a MOSFET differential amplifier comprised of input MOSFETs 10 and 12, load impedance MOSFETS 24 and 26 and current source MOSFET 38 each having a gate, drain and source. The gate of MOSFET 10 is coupled to an input terminal 14 and the drain is coupled to a first output terminal 16. The source of MOSFET 10 is coupled to a feedback node 18. MOSFET 10 serves to provide the first of two transconductance functions in the differential amplifier. The current through this MOSFET is forced to remain substantially constant for both differential and common node input signals by the action of a means for providing feedback to be described more fully below.

The gate of MOSFET 12 is coupled to the second input terminal 20, and its drain is coupled to second output terminal 22. Its source is coupled to feedback node 18. MOSFET 12 supplies the second transconductance function of the differential amplifier i.e., it attempts to change its drain to source current for changing gate to source voltages.

High impedance loads are provided by MOSFETs 24 and 26. Their drains are coupled to a first voltage source 28, which for N channel technology IC's, is usually a $V_{CC}$ of positive five volts. Their sources are coupled respectively to the first and second output terminals 16 and 22. These MOSFETs could be enhancement type devices with their gates coupled to their sources or could have their gates coupled to a clock signal having a predetermined characteristic chosen to supply the proper impedance during active operation but zero current in a powered down state. However, in the preferred embodiment shown, they are depletion type MOSFETs with their gates coupled to their sources. The geometry of these two MOSFETs is selected to establish the proper operating point for input MOSFETs 10 and 12. Depletion type devices are chosen because they can supply a higher impedance and therefore higher gain and lower power dissipation because of lower current during quiescent operation as explained more fully at pages 267 and 268 and the accompanying material of MOS/LSI Design and Application by W. N. Carr and Jack P. Mize, McGraw-Hill Book Company (1972) which publication is incorporated herein by reference (hereinafter referred to as Carr and Mize).

The circuitry for providing feedback to the differential amplifier to implement the differential to single ended conversion and to increase the common mode rejection includes MOSFETs 30, 32, 34, 36 and 38. The gate of MOSFET 30 is coupled to the first output terminal 16 and its drain is for coupling to the first voltage source 28, $V_{CC}$. Its source 46 is coupled to the drain of MOSFET 32 and to the gate of MOSFET 34. MOSFET 30 serves to provide a feedback signal at its source proportional to and of the same polarity as the signal at the first output terminal 16. It does this in cooperation with the other elements in the feedback means as will be described more fully below.

MOSFET 32 serves as a current source for supplying a substantially constant current. Its gate is coupled to the gate of MOSFET 36 both of which are coupled to circuitry for supplying a substantially constant gate drive voltage as will be described more fully below. The source of MOSFET 36 is for coupling to a second voltage source 44, $V_{BB}$, which, in N channel MOSFET technology, is the substrate bias voltage of around negative five volts. In other embodiments, MOSFET 32 could be replaced by a very high impedance device and, ideally, would be an infinite impedance connected to a very large negative voltage source. As illustrated in this preferred embodiment, it is a MOSFET which has a finite output impedance looking into the drain and which has a constant drain to source current by virtue of its constant gate to source voltage.

The drain current characteristics of MOSFET type devices in relation to drain to source and gate to source voltages are derived quantitatively and are qualitatively illustrated and explained in Carr and Mize, Chapter 1, MOS Device Physics, pp. 1-56. In particular, the drain current characteristic of an enhancement type device operating in the linear or triode region is, as given in Carr and Mize formula 1-104, p. 44:

$$I_D = K \left[ (V_G - V_T)V_D - \frac{V_D^2}{2} \right] \quad (1)$$

and the drain current in the saturation region where, in absolute values, $V_D = V_G - V_T$ is given by:

$$I_D = K \frac{(V_G - V_T)^2}{2} \quad (2)$$

where:
$I_D$ = drain to source current;
$K$ = a constant directly proportional to carrier mobility, permeability of the oxide, and width of the channel region and inversely proportional to the thickness of the oxide and the length of the channel;
$V_G$ = gate to source voltage;
$V_T$ = threshold voltage at which current starts to flow;
$V_D$ = drain to source voltage.

It is seen from equation 2 that in saturation for a constant gate to source voltage, the drain current would remain relatively constant if plotted against the drain to source voltage since $V_D$ does not appear in the formula. This assumes that $V_T$, the threshold voltage, remains constant, as it does normally if body effect is ignored. The threshold voltage is determined generally by the construction of the device and is a constant except for the effect of back gate bias caused by changes in the voltage of the substrate relative to the conducting channel. An expression for $V_T$ taking this effect into account is given in equation 1-122 of Carr and Mize.

Thus, drain current in the saturation region is constant for a constant gate to source voltage even if the drain to source voltage changes. If plotted against drain to source voltage on the abscissa, the drain current family would be a set of parallel horizontal lines, one for each discrete value of gate to source voltage with higher $V_G$ giving a higher and constant drain current. Such a horizontal drain current characteristic represents an infinite output impedance for MOSFET 32 which is not the case for real MOSFETs. They have a high but finite drain to source resistance in the saturation region which is caused by secondary effects. This finite output resistance results in some small slope to the drain characteristics of MOSFET 32.

The first feedback signal at the source 46 of MOSFET 30 is caused by the substantially constant current flowing in line 46 by the action of MOSFET 32. Since substantially zero current flows into the gate of MOSFET 34, the drain current of MOSFET 30 is substantially equal to that of MOSFET 32 and is substantially constant. MOSFETs 30 and 32 are seen to be operating in a source follower configuration with the output voltage applied to the gate of MOSFET 34. Because the voltage gain of a source follower is near unity, the voltage at the gate of MOSFET 34 tracks the voltage at the first output terminal 16. A quantitative analysis of a source follower amplifier is as given in Carr and Mize, section 9.3.2 at pages 282 et seq.

Stated another way and taking equations one and two into account, the physical characteristics of MOSFETs 30 and 32 are selected so that they are operating as a source follower with MOSFET 30 in saturation and with a substantially constant current flowing in line 46. As the voltage on the first output terminal 16 attempts to change, the source 46 of MOSFET 30 must follow it so as to maintain a substantially constant gate to source voltage. The voltage at the gate of MOSFET 34 will be one threshold voltage plus a small amount of turn on gate to source voltage below the voltage at first output terminal 16. There will be constant tracking between the voltage at output terminal 16 and the voltage on the gate of MOSFET 34 with the voltage on the gate of MOSFET 34 always a constant value lower than the voltage at first output terminal 16.

MOSFET 36, like MOSFET 32, serves as a current source for supplying a substantially constant current. Its source is for coupling to the second voltage source 44, $V_{BB}$. Its drain 42 is coupled to the source of MOSFET 34 which has its drain coupled to the first output terminal 16. MOSFET 36 has the same gate drive as MOSFET 32 and its geometry is the same, therefore its drain current is substantially the same as MOSFET 32.

MOSFET 34 serves to supply voltage-shunt feedback i.e., a negative second feedback signal, to first output terminal 16. Because the current through MOSFET 34 is substantially constant, and because its gate voltage is tracking the voltage at first output terminal 16, its source voltage has to change so as to track the voltage at the source 46 of MOSFET 30. The source voltage must change to maintain a substantially constant gate to source voltage across MOSFET 34. That substantially constant gate to source voltage across MOSFET 34 is comprised of the $V_T$ of MOSFET 34 plus a bit of turn on voltage which establishes its quiescent bias point.

In reality, the gate to source voltage of MOSFET 34 is not quite constant. MOSFETs 34 and 36 are operating in the saturation mode, and there is a high but finite resistance between the source of MOSFET 34 and the second voltage source 44, $V_{BB}$. As the gate voltage starts to rise relative to the source, the transconductance of MOSFET 34 tries to increase the drain current. The increasing drain current passes through the very high output impedance of MOSFET 36 thereby raising the drain to source voltage across MOSFET 36. This raises the voltage on the source 42 of MOSFET 34 but not quite as much as the gate voltage went up. The slightly increased gate to source voltage and slightly increased drain current through MOSFET 34 causes the voltage at the first output terminal 16 to tend to drop back toward its original level before the input signals changed. The end result is that the voltage at output terminal 16 remains substantially constant.

MOSFET 34 can be visualized as a standard transistor amplifier, with a high feedback resistance between its source and ground and a still higher load resistance between its drain and ground through first voltage supply 28, $V_{CC}$. As the gate voltage increases, the source voltage increases but not quite as much, thereby increasing the drain current through the load resistor. This causes an increased voltage drop across the load, and lowers the output voltage at the drain.

The load impedance for MOSFET 34 is the fixed impedance of MOSFET 24 in parallel with the output impedance of MOSFET 10. The voltage gain for MOSFET 34 from its gate to its drain terminal would depend upon the transconductance of MOSFET 34 and the ratio of its load impedance to the impedance in its source. The higher the voltage gain for MOSFET 34, the more stable will be the voltage at first output terminal 16.

MOSFET 38 completes the circuitry for providing feedback. It has its gate coupled to the source 42 of MOSFET 34 and its source coupled to the second voltage source 44, $V_{BB}$. Its drain is coupled to feedback node 18. MOSFET 38 serves to increase the common mode rejection of the differential amplifier and to complete the differential-to-single-ended conversion of the differential amplifier. It does this as follows.

As the voltage at the source 42 of MOSFET 34 rises and falls with attempted changes in output voltage at the first output terminal 16, the gate to source voltage of MOSFET 38 rises and falls. This causes the drain current of MOSFET 38 to rise and fall and the voltage at feedback node 18 to vary in inverse proportion. That is, as the voltage at its gate rises, the drain current of MOSFET 38 increases and the voltage drop across its load increases thereby decreasing the voltage at its drain, feedback node 18. This has the following effect for common mode input signals.

When the signals at input terminals 14 and 20 are both rising in common mode relative to second voltage source 44, the transconductance of input MOSFETs 10 and 12 tries to convert the voltage rise at the gates into increased drain current due to the finite output resistance of MOSFET 38. Increasing drain current would tend to make the voltages at first and second output terminals 16 and 22 tend to fall. However, the feedback means corrects the voltage at first output terminal 16 back to its relatively constant value.

The temporary fall in voltage on first output terminal 16 is transmitted to the source 42 of MOSFET 34 as previously explained. This fall in voltage is applied to the gate of MOSFET 38 and tends to decrease its drain current. This causes the voltage at feedback node 18 to rise and decreases the gate to source voltage of both input MOSFETs back to its original level. That is, the temporary rise in gate to source voltage is referred back to the source of input MOSFETs 10 and 12 through the circuitry for supplying feedback, and causes the source voltage on the input MOSFETs to rise such that the gate to source voltage on both remains constant. Constant gate to source voltage translates into constant drain current in input mosfets 10 and 12 and into a substantially constant voltage at first and second output terminals 16 and 22. Common mode input signals, therefore, cause no change in the output signal of the differential amplifier at second output terminal 22.

For differential mode input signals, the effect of the circuitry for providing feedback is to cause substantially all of the output signal of the differential amplifier to appear at said second output terminal 22 to effect a differential-to-single-ended conversion with substantially no loss in output signal.

The mechanism of this conversion is as follows. Assume that the voltage on input terminal 14 starts to rise but the voltage at input terminal 20 remains constant. By the previously explained mechanism, the current through input MOSFET 10 is held constant by the rise in source voltage at feedback mode 18. However, this same rise in source voltage at feedback node 18 has the effect of decreasing the gate to source voltage of input MOSFET 12 thereby tending to decrease its drain current. Therefore, substantially all the difference in input voltages between input terminals 14 and 20 appears between the gate and source of input MOSFET 12. This input difference voltage is translated into a change in drain current for input MOSFET 12 equal to the transconductance of that device multiplied by the small signal gate to source voltage. This decreased drain current is reflected at the second output terminal as a decreased output signal current. The voltage at this second output terminal is held constant by a feedback network which is similar in construction and operation to the circuitry for providing feedback coupled the first output terminal. Because the voltage at the second output terminal is held constant, the current through load impedance 26 remains constant since MOSFET 26 is a depletion device connected to represent a fixed impedance. Because the current flowing into second output terminal 22 through MOSFET 26 is constant, but the drain current flowing out through MOSFET 12 is decreasing, the output current from the second output terminal 22 through MOSFET 50 has to increase.

The circuitry connected to the second output terminal serves both as a feedback network to keep the D.C. voltage level at the second output terminal constant, and as a D.C. level shifting circuit for the small signal current. MOSFET 48 has its gate coupled to second output terminal 22 and its drain is for coupling to the first voltage source 28. MOSFET 50 has its drain coupled to second output terminal 22 and its gate 56 coupled to the source of MOSFET 48. MOSFET 52 has its drain 56 coupled to the source of MOSFET 48, and the source of MOSFET 52 is adapted for coupling to the second voltage source 44, $V_{BB}$. MOSFET 54 has its drain 58 coupled to the source of MOSFET 50. The drain node of MOSFET 54 serves as a third output terminal. The source of MOSFET 54 is adapted for coupling to second voltage source 44, $V_{BB}$. The gate of MOSFET 54 is coupled to the gate of MOSFET 52, and the gates of both are coupled to constant current source 60 so as to receive the same gate drive as MOSFETs 32 and 36. The geometries of MOSFETs 52 and 54 are identical to the geometries of MOSFETs 32 and 36 and all four have the same gate drive voltage. Thus, all of MOSFETs 32, 36, 52 and 54 have identical and substantially constant currents.

The mechanism for holding the voltage at second output terminal 22 substantially constant is the same as previously explained. The D.C. level component of the output signal at output terminal 22 is shifted downward to a D.C. level at third output terminal 58 which is lower by the gate to source voltage of MOSFET 48 and the gate to source voltage of MOSFET 50. In quiescent operation, the gate to source voltages of MOSFETs 48 and 50 are substantially constant and are such as to shift the D.C. level down to a level substantially near the D.C. level of the second voltage source 44.

That is to say MOSFET 48 provides a feedback signal at its source 56 which is proportional to and of the same polarity as the signal at second output terminal 22. MOSFET 50 provides a signal at its source 58 which is proportional to and of the same polarity as the signal at the second output terminal 22, but which has a D.C. level substantially near that of the second voltage source 44. MOSFETs 52 and 54 cause substantially constant currents to flow in their drains.

Constant current source 60 provide a substantially constant current at the drains of MOSFETs 32, 36, 52 and 54 by providing them with a gate voltage which is substantially constant.

Constant current source 60 is comprised of MOSFETs 62, 64, 66 and 68. MOSFET 62 is a depletion type MOSFET having its geometry proportioned relative to MOSFETs 24 and 26 such that the drain current through MOSFET 62 is always substantially near one half the current flowing through MOSFETs 24 and 26. Specifically, the channel width to channel length ratio of MOSFET 62 is one half that of MOSFETs 24 and 26.

MOSFET 62 has its drain adapted to be coupled to the first voltage source 28 and has its gate coupled to its source. MOSFET 64 has its drain adapted to be coupled to the first voltage source 28 and has its gate coupled to the source of MOSFET 62. MOSFET 66 has its drain 70 coupled to the source of MOSFET 64 and to its own gate. The drain/gate of MOSFET 66 is also coupled to the gates of MOSFETs 32, 36, 52 and 54. The source of MOSFET 66 is for coupling to the second voltage source 44, $V_{BB}$.

MOSFET 68 has its drain 72 coupled to the source 72 of MOSFET 62 and its gate coupled to the gate of MOSFET 66. The source of MOSFET 68 is for coupling to the second voltage source 44.

The operation of constant current source 60 is as follows. MOSFET 62 is constructed so that it acts as a mirror for process variations and supply voltage variations that affect the current through MOSFETs 24 and 26. That is, since the width to length ratio of MOSFET 62 is one half that of MOSFETs 24 and 26, if processing variations between batches of chips change the $V_T$'s of MOSFETs 24 and 26 thereby changing the currents therein, the same variations will affect the current in MOSFET 62 in the same proportion. That is if the supply voltage or process variations cause the currents through MOSFETs 24 and 26 to increase by ten percent, the same variations will cause the current through MOSFET 62 to increase by ten percent.

The current through MOSFET 62 is also the drain current through MOSFET 68 and is substantially equal to one half the current that flows through each of MOSFETs 24 and 26. The geometry of MOSFETs 68 and 66 are identical and is the same geometry as MOSFETs 32, 36, 52 and 54. The gate drives of all these six MOSFETs 68, 66, 32, 36, 52 and 54, is set by MOSFET 64 which forms a feedback loop with MOSFETs 66 and 68 to stabilize the voltage at the drain 72 of MOSFET 68 and at the drain/gate 70 of MOSFET 66.

The voltage at the drain 72 of MOSFET 68 is initially set by the drain to source voltage of MOSFET 62—a voltage which is set by the construction of MOSFET 62 determines its output resistance. If processing or supply voltage variations tend to cause movement in the voltage at node 72, the drain current of MOSFET 64 will be changed because its gate is coupled to node 72. MOSFET 64 is operating as a transconductance source follower with its source resistance equal to the resistance of enhancement type MOSFET 66 with its gate coupled to its drain. That is, MOSFET 66 provides a low impedance path from the second voltage source 44 to the source of MOSFET 64. When the drain currents of MOSFETs 64 and 66 start to move, the voltage at the drain node 70 also moves and, since it is coupled to the gate of MOSFET 68, it changes the gate drive of MOSFET 68 thereby changing its drain current. When the drain current through MOSFET 68 changes, the voltage at node 72 tends to change in a direction opposite the initial change which start the movement.

For example, if the voltage at node 72 tends to move up, MOSFET 64 provides a feedback signal at its source node 70 which is proportional to and of the same polarity as the voltage at the node 72. The rising voltage at node 70 causes the drain current through MOSFETs 68 and 62 to increase, which tends to cause the voltage at drain node 72 to fall back toward its original level. That is MOSFET 68 provides a sufficient negative feedback to the source of MOSFET 62 to cause node 72 to remain at a substantially constant voltage so that the current through MOSFETs 62 and 68 remains substantially constant. This in turn causes the voltage at the drain 70 and gates of MOSFETs 68, 66, 32, 52 and 54 to remain substantially constant. Because of the identical geometry of all six of these MOSFETs and identical gate drive voltage which is substantially constant, the drain currents of all six MOSFETs are substantially constant.

The last link in the biasing network is MOSFET 38. This device is constructed to have twice the channel width to channel length ratio of MOSFETs 24 and 26. In addition, MOSFETs 30 and 34 are so constructed that the drop in D.C. level during quiescent operation from the D.C. level of first output terminal 16 to the gate node 42 of MOSFET 38 is such that, in a quiescent state, the gate to source voltage of MOSFET 38 is the same as MOSFETs 32 and 36. If the current flowing in each of MOSFETs 24 and 26 is 2I, then the quiescent current flowng in MOSFETs 62, 64, 68, 66, 32, 36, 52, 54, 30, 34, 50 and 48 are all I. Since the quiescent currents flowing in MOSFETs 34 and 50 are I, then the currents flowing in MOSFETs 10 and 12 must be I since 2I is flowing in MOSFETs 24 and 26 and substantially zero current flows into the gates of MOSFETs 30 and 48. Here, the quiescent current flowing in MOSFET 38 is 2I.

The circuitry for amplifying the output signal at the third output terminal 58 i.e., the drain node of MOSFET 54, is the second gain stage. It is comprised of MOSFETs 74 and 76. MOSFET 74 could be an enhancement mode device with its gate coupled to its drain and to first voltage source 28, or it could be either an enhancement or depletion type MOSFET with its gate coupled to a fourth voltage source having a predetermined characteristic for causing this device to supply a load impedance during active operation and to shut off all current during a powered down state. In the preferred embodiment, MOSFET 74 is a depletion type device having its gate coupled to its source and having its drain for coupling to the first voltage source 28. MOSFET 74 supplies the load impedance for MOSFET 76 which amplifies the signal at third output terminal 58 and for presenting it at a fourth output terminal 78. MOSFET 76 has its drain coupled to the source of MOSFET 74 and to fourth output terminal 78, and has its gate coupled to the third output terminal 58, and has its source adapted for coupling to a second voltage source 44, $V_{BB}$.

Capacitor 80 and impedance device 82 are used for internal compensation of the differential amplifier. Capacitor 80 can be a thin film device or a PN junction capacitor but, in the preferred embodiment, is a MOS capacitor having a first terminal coupled to said third output terminal 58.

Impedance device 82 can be a thin film or diffused resistor but, in the preferred embodiment, is a depletion type MOSFET with its gate coupled to its source to make it act like a high impedance. Its source is coupled to the other terminal of capacitor 80. The drain of MOSFET 82 is coupled to fourth output terminal 78.

Capacitor 80 and MOSFET 82 combine to turn the second gain stage into an integrator. The purpose of capacitor 80 is to split the poles in the transfer function of the second gain stage such that the first and dominant pole caused by the input capacitance of MOSFET 76 seen from third output terminal 58 is moved down in frequency such that it occurs at around one kilohertz. Simultaneously, the second pole caused by the lumped capacitance coupled to the fourth output terminal 78 occurs at a higher frequency than the unity gain point i.e., two megahertz or higher.

The purpose of this pole splitting technique is to insure amplifier stability. That is, by moving the second pole out beyond the unity gain point, sufficient phase margin is achieved such that the phase shift is not one-hundred and eighty degrees at the unity gain point—a condition which could cause oscillation of the amplifier.

The purpose of impedance device MOSFET 82 is to move the typical right half plane zero that results from pole splitting into the left hand plane to cancel the second dominant pole to insure stability. Its impedance is chosen to cause it to lie exactly on top of the second pole so that the zero does not extend the unity gain point out to an area where one hundred and eighty degrees phase shift would occur which could result in instability. Methods of compensating amplifiers are well known in the art, and further explanation of this subject is found in Gray and Meyer, Analysis and Design of Analog Integrated Circuits, Wiley & Sons, Inc. (1977), Library of Congress number TK 7874.6688, which publication is incorporated herein by reference with particular reference to Section 9.4.2, pp. 512 et. seq.

The second gain stage—MOSFETs 76, 74, 82 and capacitor 80—integrates the current output from the differential input stage after it has passed through the level shift circuit comprised of MOSFETs 48, 50, 52 and 54. To minimize the phase shift through the level shift circuit, MOSFETs 48 and 50 are arranged in a local shuntshunt feedback loop to provide a low impedance through the level shift stage.

A pulse code modulation filter chip has to be able to drive various kinds of loads applied externally by the user. Thus, the operational amplifier as described herein in FIG. 1 must have some sort of output stage when it is used at the output of the transmit or receive filter. This output stage must have a low output impedance and a high current source and sink capability yet it must not consume inordinate amounts of bias power. The output stage must be able to drive minimum resistive loads, typically three thousand ohms, with maximum capacitance in shunt while faithfully following a large signal waveform peaking at plus or minus 3.2 volts.

Figure 2:
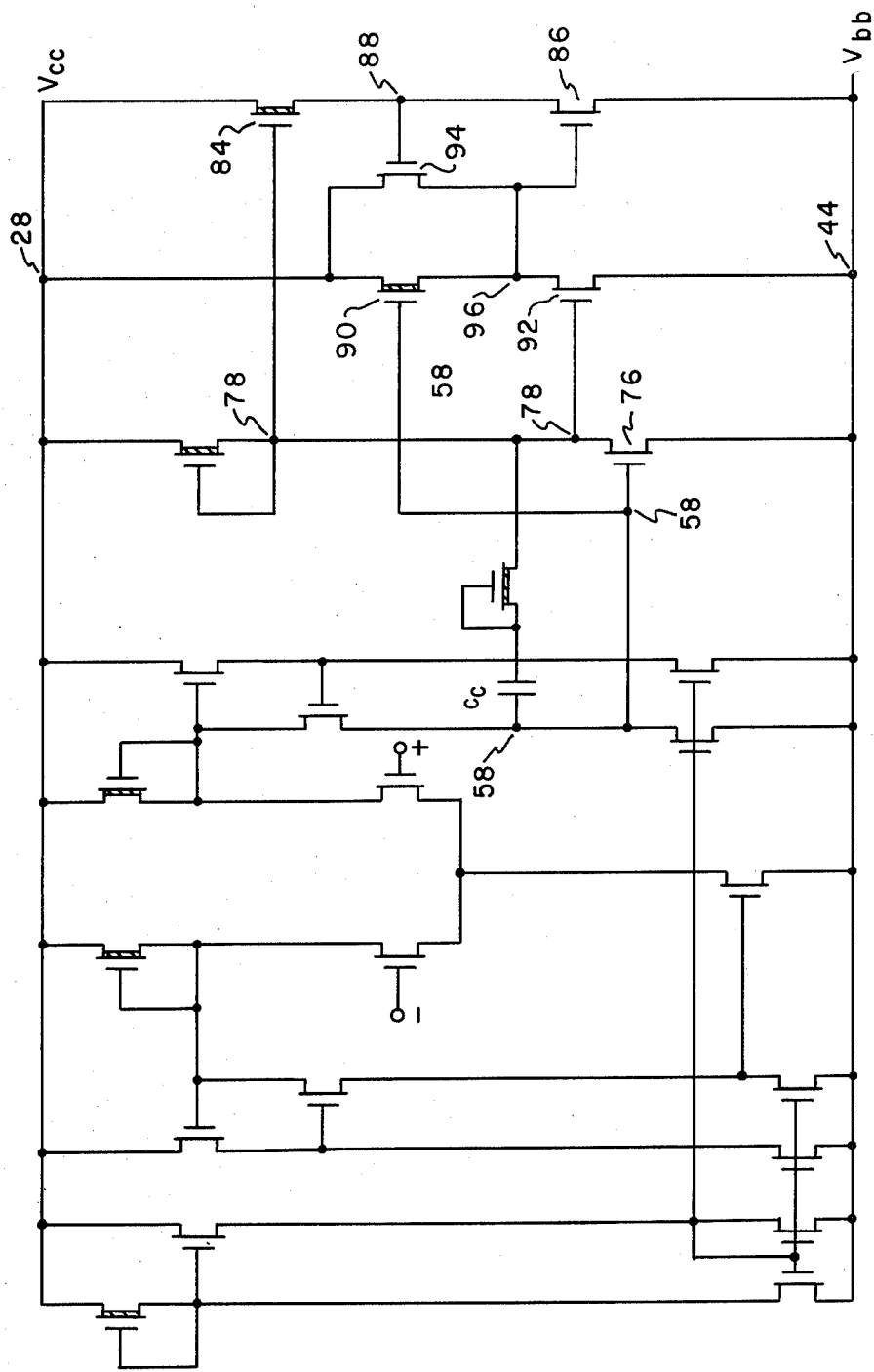
FIG. 2 is a schematic diagram of the operational amplifier with an output stage.

The output stage is shown as coupled to the operational amplifier in FIG. 2. MOSFETs 84 and 86 provide the large current drive capability of the output stage by simulating complementary channel devices acting in push-pull fashion. MOSFET 84 has its drain adapted for coupling to the first voltage source 28, $V_{CC}$. It has its gate coupled to the fourth output terminal 78 i.e., the drain node of MOSFET 76, and its source is coupled to a fifth output terminal 88 which serves as the output of the operational amplifier. There is also connected to this output terminal a means for providing a load impedance for MOSFET 84 as will be explained in more detail below. MOSFET 84 operates in a source follower mode, establishing a low low output impedance at fifth output terminal 88.

The circuitry for providing a load impedance for MOSFET 84 is coupled between the source of MOSFET 84 and the second voltage source 44. This circuitry must function to provide a current source which sinks an increasing amount of current from the external load coupled to the fifth output terminal during one half of the output sinusoid but to sink a decreasing amount during the other half cycle. That is, as the output signal at the fifth output terminal 88 swings more negative from zero volts for N channel devices, the current source must sink an increasing amount of current from the load. But, when the output voltage increases in a positive direction from small signal levels near zero, the current source must minimize the current to the second voltage source 44 while serving as the load impedance for MOSFET 84 operating as a source follower.

This output stage could be implemented in many different ways including use of complementary transistors operating in class B or AB to provide output currents of either polarity. Also, by use of negative feedback, the effective output impedance can be reduced. However, in the preferred embodiment, N channel devices are used to simulate a P channel device so that a complementary output transistor pair can be simulated.

In the preferred embodiment, the circuitry for providing the above specified current source includes MOSFETs 86, 90 92 and 94. MOSFET 90 is a depletion type device in the preferred embodiment, and has its drain for coupling to the first voltage source 28, and has its gate coupled to the gate 58 of MOSFET 76. MOSFET 90 is for providing a feed forward path from the third output terminal to the source of MOSFET 90 to minimize phase shift in the second gain stage, MOSFETs 76 and 74. This device is designed such that there is substantially zero offset voltage between the voltage at the gate 58 and the source 96 of MOSFET 90.

MOSFET 86 has its drain coupled to fifth output terminal 88 and its source for coupling to second voltage source 44, and has its gate coupled to the source 96 of MOSFET 90. MOSFET 86 is for sensing the signal on the source 96 of MOSFET 90 which is an indicator of the output voltage at fifth output terminal 88. MOSFET 86 becomes more conductive for increasing output signals in one half of the output signal sinusoid, and becomes less conductive for small signals near zero and increasingly less conductive for increasing signals in the other half of the output signal sinusoid.

In the preferred embodiment, MOSFETs 90 and 92 are, respectively, depletion type and enhancement type devices and are constructed so that the voltage on the source 96 of MOSFET 90 follows the voltage on its gate 58 with substantially zero offset voltage, and are constructed such that MOSFET 90 begins to become more conductive and MOSFET 92 less conductive when the voltage on the gate 58 of MOSFET 76 causes it to become more conductive. This is to minimize cross over distortion.

Some feedback circuitry coupled to the fifth output terminal 88, the first voltage source 28, and the gate of MOSFET 86 is helpful for lowering the output impedance seen by an external load coupled to the fifth output terminal 88. It also serves to provide feedback to the gate of MOSFET 86 to stabilize the output voltage at output terminal 88 by helping to minimize overshoot for highly capacitive loads.

MOSFET 94 serves the above purpose having its drain for coupling to the first voltage source 28, its gate coupled to the fifth output terminal 88 and its source coupled to the gate 96 of MOSFET 86. MOSFET 94 is for causing MOSFET 86 to become more conductive when overshoot occurs on the fifth output terminal for minimizing the overshoot voltage by sinking some current to the second voltage source 44 through MOSFET 86 by temporarily causing it to decrease its impedance.

MOSFET 94 also assists the gate of MOSFET 86 to be driven more rapidly into a conductive state by MOSFETs 90 and 92 during the half cycles where current is being sunken from the load to second voltage source 44. That is, for N channel devices, as the output voltage swings more negative, MOSFET 94 becomes less and less conductive thereby assisting the gate 96 of MOSFET 86 to be driven harder into a conductive state. During positive half cycles both MOSFETs 94 and 92 are becoming more conductive while MOSFET 90 is becoming less conductive. This results in the gate 96 being driven more and more negative which causes MOSFET 86 to become less and less conductive for increasing positive output signals. MOSFET 94 works against the action of MOSFET 92 however in tending to keep the gate 96 of MOSFET 86 from being driven so negative as to cut MOSFET 86 completely off. The total result is that during positive half cycles MOSFET 84 dominates and supplies as much current as the load needs within its capability. But at approximately zero output voltage, MOSFET 86 begins to take over and starts to become more and more conductive sinking more and more current from the load.

Thus it is seen that power consumption by the output stage is minimized by the push-pull operation of MOSFETs 84 and 86 minimizing D.C. bias current by preventing an unimpeded path from the first voltage source 28, $V_{CC}$ to the second voltage source 44, $V_{BB}$ for substantially all output voltages. If MOSFETs 90 and 92 are properly constructed to work in push-pull unison with MOSFET 76, cross over distortion is also minimized. The output stage described herein can also be used with any other amplifier.

More power is saved by the addition of circuitry for substantially stopping power dissipation upon receipt of a signal at a power down node. These devices are shown in FIG. 3 as MOSFETs 98, 100, 102, 104, 106, 108, 110, 112, 114, 116.

Figure 3:
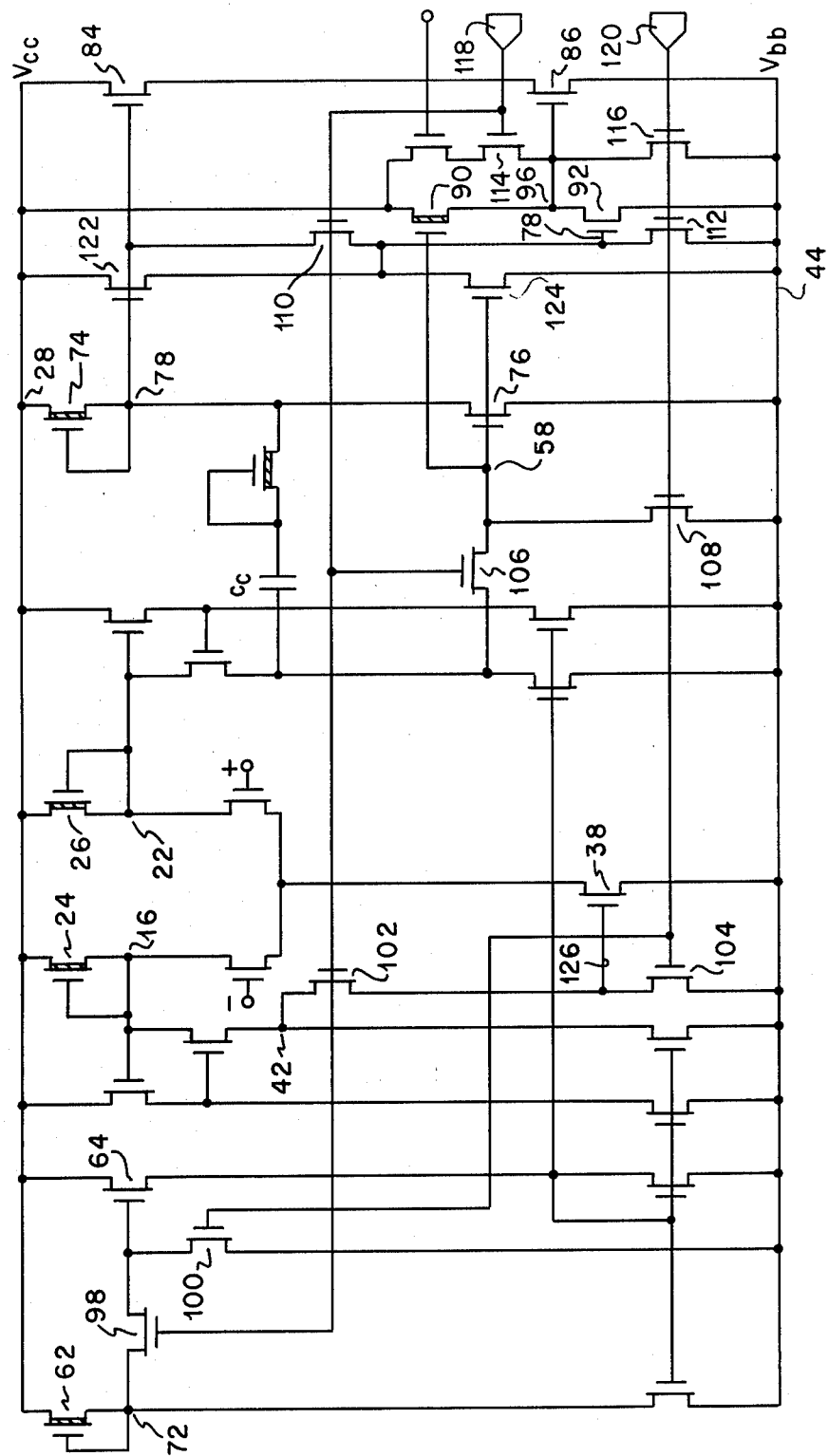
FIG. 3 is a schematic diagram of the operational amplifier with an output stage as modified for use in situations where large driving currents must be supplied and showing a plurality of power-down switching devices.

A circuit coupled to MOSFET 38 stopping power dissipation therein and in the differential amplifier is comprised of MOSFETs 102 and 104 with the connections as shown in FIG. 3. When power down is desired, power down node 118 is driven negative and power down node 120 is driven positive turning MOSFET 102 off and 104 on. This condition shuts off MOSFET 38. MOSFETs 24 and 26 keep conducting until the capacitance at nodes 16 and 22 charge up to the level of $V_{CC}$ at which time no more current flows.

A circuit coupled to MOSFET 62 for stopping power dissipation therein is comprised of MOSFETs 98 and 100. When the power down signals are received, MOSFET 98 turns off and MOSFET 100 turns on shutting off MOSFET 64. MOSFET 62 continues to conduct until the capacitance of node 72 charges up to $V_{CC}$ at which time conduction stops.

A circuit coupled to the gate of MOSFET 76 for stopping power dissipation therein is comprised of MOSFETs 106 and 108. When the power down signals are received, MOSFET 108 turns on and MOSFET 106 shuts off. This shuts off MOSFET 76. MOSFET 74 continues to conduct until the capacitance of node 78 charges up to $V_{CC}$ at which time conduction in MOSFET 74 stops.

A circuit coupled to MOSFETs 92 and 86 for stopping power dissipation therein upon signals at power down nodes 118 and 120 is comprised of MOSFETs 110, 112, 114 and 116. Upon receipt of the power down signals at nodes 118 and 120, MOSFET 110 turns off and 112 turns on thereby shutting off MOSFET 92. MOSFET 90 then stops conducting as soon as the capacitance of node 96 charges up to a level sufficient to turn off MOSFET 90. Likewise, MOSFET 114 shuts off and MOSFET 116 turns on shutting off MOSFET 86.

MOSFETs 122 and 124 serve as a level shifting circuit to make the output stage more efficient where MOSFETs 86 and 84 are constructed to supply large output currents. The circuit functions according to the same principles previously explained except that MOSFETs 122 and 124 are coupled as a source follower to step the D.C. level of the signal on the fourth output terminal 78 down to a lower level.

MOSFET 122 has its drain for coupling to the first voltage source 28, and has its gate coupled to the source 78 of MOSFET 74, and has its source coupled to the drain of MOSFET 124. MOSFET 124 also has its drain coupled to the gate 78 of MOSFET 92, and its gate coupled to the gate 58 of MOSFET 76, and has its source for coupling to the second voltage source 44. This enables MOSFET 92 to be built with a lower threshold voltage so that it does not have to begin to turn on at the high D.C. level of the drain of MOSFET 76 when that device begins to turn on. This level shift in the output stage prior to signal inversion substantially lessens the possibility of cross-over distortion in the transition of MOSFETs 84 and 86.

Although the invention has been described in terms of the preferred embodiment disclosed herein, it will be apparent to those skilled in the art that modifications are possible in numerous. These modifications are intended to be included in the scope of the claims appended hereto.

I claim:

1. A differential amplifier for connection to a first voltage source (28) to amplify a difference signal, said differential amplifier having two input terminals (14 and 20) and first and second output terminals (16 and 22) and having a feedback node (18), and having a feedback means comprised of:
   a first MOSFET (30) having a source, drain and gate, said gate coupled to said first output terminal (16), said drain for connection to a first voltage source (28) and said source (46) for connection to a first current source means for supplying a substantially constant current, for providing a first feedback signal at said source (46) proportional to the signal at said first output terminal (16);
   a second MOSFET (34) having a source, drain and gate, said gate coupled to said source (46) of said first MOSFET and said drain coupled to said first output terminal (16) and said source coupled to a second current source means for supplying a substantially constant current, for providing a negative second feedback signal to said first output terminal (16) tending to keep the voltage on said terminal substantially constant;
   a third MOSFET (38) having a gate, drain and source, said drain coupled to said feedback node (18), said gate coupled to said source (42) of said second MOSFET and said source for coupling to a second voltage source (44) for receiving said first feedback signal and for converting it to a third negative feedback signal at said feedback node (18) causing said differential amplifier to reject substantially all common mode input signals and causing substantially all of the amplified difference signals to appear at said second output terminal (22).

2. A differential amplifier as defined in claim 1 furthur comprising:
   a third MOSFET (48) having a source, drain and gate, said drain for coupling to said first voltage source (28) and said gate coupled to said second output terminal (22);
   a fourth MOSFET (50) having a source, drain and gate, said drain coupled to said second output terminal (22) and said gate coupled to said source of said third MOSFET;
   a first current source means coupled to said source (56) of said third MOSFET for causing a substantially constant drain current to flow in said third MOSFET;
   a second current source means coupled to said source (58) of said fourth MOSFET for causing a substantially constant drain current to flow through said fourth MOSFET.

3. A differential amplifier having a pair of input terminals (14 and 20) and first (16) and second (22) output terminals for amplifying a difference signal present between said input terminals which comprises:
   first and second depletion mode MOSFETs (24 and 26) each having a drain, a source, and a gate, said drains for coupling to a first voltage source (28) and said gate of said first MOSFET coupled to its source (16) and said gate of said second MOSFET coupled to its source (22);
   a third MOSFET (10) having a drain, source, and gate, said drain coupled to said first output terminal (16);
   a fourth MOSFET having a drain, source and gate, said drain coupled to said output terminal (22), said gate coupled to the other of said input terminals (20) and said source coupled to said source (18) of said third MOSFET;
   a fifth MOSFET having a drain, source and gate, said gate coupled to said first output terminal (16) and said drain for coupling to said first voltage source (28);
   a sixth MOSFET having drain, source and gate, said gate coupled to said source (46) of said fifth MOSFET, and said drain coupled to said first output terminal (16);
   a second current source means coupled to said source (42) of said sixth MOSFET and for coupling to said second voltage source (44) for causing a substantially constant current to flow through said sixth MOSFET;
   a seventh MOSFET (38) having a gate, drain and source, said gate coupled to said source (42) of said sixth MOSFET, said drain coupled to said source (18) of said third MOSFET and said source for coupling to said second voltage source (44).

4. A differential amplifier as defined in claim 3 wherein said third and fourth MOSFETs are devices using N channel construction with unimplanted channels.

5. A differential amplifier as defined in claim 1 or 3 further comprising:
   a means coupled between said second output terminal (22) and said second voltage source (44) for shifting the D.C. level of the amplified difference signal appearing on said second output terminal (22) to a D.C. level substantially near said second voltage source (44) voltage level.

6. A differential amplifier as defined in claim 3 further comprising:
   an eighth MOSFET (48) having a source, drain and gate, said drain for coupling to said first voltage source (28) and said gate coupled to said second output terminal (22);
   a ninth MOSFET (50) having a source, a gate and a drain, said drain coupled to said second output terminal (22) and said gate coupled to said source of said eighth MOSFET;
   a third current source means coupled to said source (56) of said eighth MOSFET for causing a substantially constant drain current to flow in said eighth MOSFET;
   a fourth current source means coupled to said source (58) of said ninth MOSFET for causing a substantially constant drain current to flow through said ninth MOSFET.

7. A differential amplifier as defined in claim 3 further comprising:
  a means coupled to said seventh MOSFET (38) for substantially stopping power dissipation in said seventh MOSFET (38) upon receipt of a signal at a power down node (118 and 120).

8. A differential amplifier having a pair of input terminals (14 and 20) and first and second output terminals (16 and 22) for amplifying a difference signal present between said input terminals which comprises:
  first and second depletion mode MOSFET each having a drain, a source, and a gate, said drains for coupling to a first voltage source (28) and said gate of said first MOSFET coupled to its source (16) and said gates for coupling to a third voltage source having a predetermined characteristic;
  a third natural MOSFET having an unimplanted channel and having a drain, source, and gate, said drain coupled to said first output terminal (16), said gate coupled one of said input terminals;
  a fourth natural MOSFET having an unimplanted channel and having a drain, source and gate, said drain coupled to said second output terminal (22), said gate coupled to the other of said input terminals (20) and said source coupled to said source (18) of said third MOSFET (10);
  a fifth MOSFET (30) having a drain, source and gate said gate coupled to said first output terminal (16) and said drain for coupling to said first voltage source (28);
  a first current means source coupled to said source of said fifth MOSFET and for coupling to a second voltage source (44) for causing a substantially constant current to flow;
  a sixth MOSFET (34) having drain, source and gate, said gate coupled to said source of said fifth MOSFET, and said drain coupled to said first output terminal (16);
  a second current source means coupled to said source of said sixth MOSFET (34) and for coupling to said second voltage source (44) for causing a substantially constant current to flow through said sixth MOSFET;
  a seventh MOSFET (38) having a gate, drain and source, said gate coupled to said source (42) of said sixth MOSFET, said drain coupled to said source (18) of said third MOSFET and said source for coupling to said second voltage source (44);
  a means coupled between said second output terminal (22) and said second voltage source (44) for shifting the D.C. level of the amplified difference signal appearing on said second output terminal (22) to a D.C. level substantially near said second voltage source (44) voltage level and having a third output terminal (58).

9. A differential amplifier as defined in claim 8 wherein said means for shifting the D.C. level of the amplified difference signal is comprised of:
  an eighth MOSFET (48) having a source drain and gate, said drain for coupling to said first voltage source (28) and said gate coupled to said second output terminal (22);
  a ninth MOSFET (50) having a source, a gate and a drain, said source coupled to a third output terminal (58) said drain coupled to a said second output terminal (22) and said gate coupled to said source (56) of said eighth MOSFET;
  a third current source means coupled to said source (56) of said eighth MOSFET for causing a substantially constant current to flow through said eighth MOSFET;
  a fourth current source means coupled to said source of said ninth MOSFET (50) for causing a substantially constant current to flow.

10. A differential amplifier as defined in claim 8 further comprising:
  a means coupled to said third output terminal (58) for amplifying the signal there appearing and for presenting the signal so amplified at a fourth output terminal (78).

11. A differential amplifier as defined by claim 9 or 10 further comprising:
  a tenth depletion type MOSFET (62) having a drain, gate and source, said drain for coupling to said first voltage source (28), said gate coupled to said source (72) and having a channel width to channel length ratio equal to one-half that of said first and second MOSFETs;
  an eleventh MOSFET (64) having a drain, gate and source, said drain for coupling to said first voltage source (28), said gate for coupling to said source (72) of said tenth MOSFET;
  a twelfth MOSFET (66) having a drain, gate and source, said drain coupled to said source (70) of said eleventh MOSFET, said gate coupled to said drain (70) of said twelfth MOSFET, and said source for coupling to a second voltage source (44);
  a thirteenth MOSFET (68) having a drain, gate and source, said drain coupled to said source (72) of said tenth MOSFET, said gate is coupled to said gate (70) of said tenth MOSFET, and said source for coupling to said second voltage source (44);
  and wherein said first current source means includes:
    a fourteenth MOSFET (32) having a gate, drain and source, said drain being coupled to said source (46) of said fifth MOSFET (30) of said twelfth MOSFET (66), and said source for coupling to said second voltage source (44);
    a fifteenth MOSFET (36) having a drain, a gate and a source, said drain coupled to said source (42) of said sixth MOSFET (34), and said gate coupled to said gate (70) of said fourteenth MOSFET and said source for coupling to said second voltage source (44);
  and wherein said third current source means includes:
    a sixteenth MOSFET (54) having a gate, source and drain, said drain coupled to said source (58) of said ninth MOSFET (50), said gate coupled to said gate of said twelfth MOSFET (66) and said source for coupling to said second voltage source (44):
  and wherein said fourth current source means includes:
    a seventeenth MOSFET (52) having a gate, a source and a drain, said drain coupled to said source (56) of said eighth MOSFET, said gate coupled to said gate (70) of said sixteenth MOSFET (54) and said source for coupling to said second voltage source (44);
  and wherein said twelfth (62), thirteenth (68), fourteenth (32), fifteenth (36), sixteenth (54) and seventeenth (52) MOSFETs all have the same geometry such that they all have the same current flowing from drain to source as is flowing in said tenth MOSFET (62), and wherein said seventh MOSFET (38) is constructed to have twice the channel width to length ratio of said thirteenth MOSFET (68), and wherein said fifth and sixth MOSFETs, are so constructed that their gate to source voltage drops are such that the gate (42) voltage of said seventh MOSFET (38) is substantially the same as the gate (70) voltage of said thirteenth MOSFET 68 at substantially all times.

12. A differential amplifier as defined in claim 11 further comprising a means coupled to said tenth MOSFET (62) for stopping power dissipation therein upon signal from a power down node (118 and 120).

13. A differential amplifier for connection to a first voltage source to amplify a difference signal having two input terminals (14 and 20) and first (16) and second (22) output terminals and having a feedback node (18) and having a feedback means including:
- a first MOSFET (30) having a source, drain and gate, said gate coupled to said first output terminal (16), said drain for connection to a first voltage source (28);
- a first current source means coupled to said source (46) of first MOSFET (30) for supplying a substantially constant current;
- a second MOSFET (34) having a source, drain and gate, said gate coupled to said source (46) of said first MOSFET (30) and said drain coupled to said first output terminal (16);
- a second current source means coupled to the source (42) of second MOSFET (34) for supplying a substantially constant current;
- a third MOSFET (38) having a gate, drain and source, said drain coupled to said feedback node (18), said gate coupled to said source (42) of said second MOSFET (34), said source for coupling to a second voltage source (44);
- a means coupled between said second output terminal (22) and a second voltage source (44) for shifting the D.C. level of the amplified difference signal appearing on said second output terminal (22) to a D.C. level substantially near said second voltage source (44) voltage level and having a third output terminal (58).

14. A differential amplifier as defined in claim 13 further comprising a means coupled to said third output terminal (58) for amplifying the signal there appearing and for presenting the signal so amplified at a fourth output terminal (78).

15. A differential amplifier as defined in claim 14 wherein said means for amplifying comprises:
- a fourth MOSFET (74) having a drain, gate and source, said drain for coupling to a first voltage source (28), said gate for coupling to a fourth voltage source having a predetermined characteristic;
- a fifth MOSFET (76) having a drain, gate and source, said drain coupled to said source (78) of said fourth MOSFET (74) and for coupling to a fourth output terminal (78), said gate coupled to said third output terminal (58) and said source coupled to second voltage source (44).

16. A differential amplifier as defined in claim 15 wherein said fourth MOSFET (74) is a depletion mode device having said gate tied to said source (78).

17. A differential amplifier as defined by claim 15 further comprising:
- a capacitor having a first (58) and second terminal said first terminal coupled to said third output terminal (58).
- a means for supplying an impedance having first and second (78) terminals, said first terminal coupled to said second terminal (78) of said capacitor and coupled to said fourth output terminal (78) for completing a compensation network for pole splitting.

18. A differential amplifier as defined in claim 14 or 15 or 16 or 17 further comprising a means coupled to said fourth output terminal (78) for providing a low output impedance and a high current drive capability.

19. A differential amplifier as defined in claim 14 or 15 or 16 or 17 further comprising:
- a sixth MOSFET (84) having a drain, gate and source, said drain for coupling to said first voltage source (28), said gate coupled to said fourth output terminal (78) and said source coupled to a fifth output terminal (88);
- a means coupled between said source (88) of said sixth MOSFET and said second voltage source (44) for providing a load impedance for said sixth MOSFET, and for simulating a complementary channel type MOSFET of opposite conductivity type for combining with said sixth MOSFET to act as a push-pull output stage.

20. A differential amplifier as defined in claim 14 or 15 or 16 or 17 further comprising:
- a sixth MOSFET (84) having a drain, gate and source, said drain for coupling to said first voltage source (28), said gate coupled to said fourth output terminal (78) and said source coupled to a fifth output terminal (88);
- a means coupled between said source (88) of said sixth MOSFET (84) and said second voltage source (44) for providing a current source which sinks an increasing amount of current from an external load coupled to said fifth output terminal (88) as the output signal at said fifth output terminal (88) increases in a first polarity half cycle of the output signal cycle but which becomes less conductive as said output signal increases in a second and opposite polarity half cycle of the output signal cycle, to serve as the load impedance for said sixth MOSFET.

21. A differential amplifier as defined in claim 15 or 16 or 17 further comprising:
- a sixth MOSFET (84) having a drain gate and source, said drain for coupling to said first voltage source (28), said gate coupled to said fourth output terminal (78) and said source coupled to a fifth output terminal (88);
- a seventh MOSFET (90) having a drain, source and gate, said drain for coupling to said first voltage source (28), said gate coupled to said gate of said fifth MOSFET (76);
- an eighth MOSFET (92) having a drain source and gate, said drain coupled to said source (96) of said eighth MOSFET (92), said source for coupling to said second voltage source (44), and said gate coupled to said drain of said fifth MOSFET (76);
- a ninth MOSFET (86) having a drain, source and gate, said gate coupled to said source (96) of said seventh MOSFET, said drain coupled to said fifth output terminal (88), and said source for coupling to said second voltage source (44);

22. A differential amplifier as defined in claim 21 wherein said seventh MOSFET (90) is a depletion mode device and said eighth MOSFET (92) is an enhancement mode device, and wherein said seventh (90) and eighth (92) MOSFETs are constructed so that the voltage on said source (96) of said seventh MOSFET follows the voltage on said gate (58) with substantially zero offset voltage, and so that said seventh MOSFET (90) begins to become more conductive and said eighth MOSFET (92) begins to become less conductive when the signal on said gate (58) of said fifth MOSFET (76) begins to make said fifth MOSFET (76) more conductive.

23. A differential amplifier as defined in claim 22 further comprising:
   a means coupled to said fourth output terminal (78), said first voltage source (28) and said second voltage source (44) for shifting the D.C. level of the signal at said fourth output terminal (78) down to a voltage substantially near the D.C. level of said second voltage source (44) and for applying this shifted signal to said gate of said eighth MOSFET (92).

24. A differential amplifier as defined in claim 21 further comprising a feedback means coupled to said fifth output terminal (88) and to said first voltage source (28) and said gate (96) of said ninth MOSFET (86) for lowering the output impedance seen by an external load coupled to said fifth output terminal (88) and to provide feeback to said gate of said ninth MOSFET (86) to stabilize the output voltage from said fifth output terminal (88) and minimize overshoot for highly capacitive loads.

25. A differential amplifier as defined in claim 24 wherein said feedback means is comprised of a tenth MOSFET (94) having a gate, a source and a drain, said drain for coupling to said first voltage source (28), said gate for coupling to said fifth output terminal (88), and said source coupled to said gate (96) of said ninth MOSFET (86);

26. A differential amplifier as defined in claim 15 further comprising a means coupled to said gate of said fifth MOSFET (76) for stopping power dissipation therein upon signal from a power down node (118 and 120).

27. A differential amplifier as defined in claim 21 further comprising a means coupled to said eighth and ninth MOSFETs (92 and 86) for stopping power dissipation therein upon signal at a power down node.

28. An output stage for an operational amplifier comprising:
   a first MOSFET (84) having a drain, gate and source, said drain for coupling to a first voltage source (28), said gate coupled to the output terminal of said operational amplifier, said source coupled to the output terminal (88) of said output stage;
   a second MOSFET (90) having a drain source and gate, said drain for coupling to a first voltage source (28), said gate coupled to an inverted output of said operational amplifier;
   a third MOSFET (92) having a drain, source and gate, said drain coupled to said source (96) of said second MOSFET, said source for coupling to a second voltage source (44), and said gate coupled to said output terminal of said operational amplifier;
   a fourth MOSFET (86) having a drain source and gate, said gate coupled to said source (96) of said second MOSFET, said drain coupled to the output terminal (88) of said output stage, and said source for coupling to said second voltage source (44); and
   a fifth MOSFET (94) having its drain for coupling to said first voltage source (28) and its gate coupled to said output terminal (88) of said output stage and having its source coupled to said gate (96) of said fourth MOSFET (86).

29. An output stage as defined in claim 28 wherein said second MOSFET (90) is a depletion mode device and said third MOSFET (92) is an enhancement mode device, and wherein said second and third MOSFETs (90 and 92) are constructed so that the voltage on said source (96) of said second MOSFET (90) follows the voltage on said gate (58) with substantially zero offset voltage, and so that said second MOSFET (90) begins to become more conductive and said third MOSFET (92) begins to become less conductive when the output signal at the output terminal of said operational amplifier increases in a first polarity and vice versa when the output signal increases in the opposite polarity.

30. An output stage as defined in claim 21 further comprising:
   a sixth MOSFET (122) having a drain, source and gate, said drain for coupling to said first voltage source, said gate for coupling to said output terminal (78) of said operational amplifier and coupled to said gate of said first MOSFET (84);
   a sixth MOSFET (124) having a drain, source and gate, said drain coupled to said source of said fifth MOSFET (122) and to said gate of said third MOSFET (92), said gate coupled to said inverting output of said operational amplifier and said source for coupling to said second voltage source (44).

31. A differential amplifier for amplifying a difference signal comprising:
   two input terminals (14 and 20);
   two output terminals (16 and 22);
   a feedback node (18);
   a feedback means coupled between one of said terminals (16) and said feedback node (18) for causing substantially all of the amplified difference signal to appear at the other said output terminal (22) and for increasing common mode rejection;
   a first MOSFET (48) having a source, drain and gate, said drain for coupling to said first voltage source (28) and said gate coupled to said second output terminal (22);
   a second MOSFET (50) having a source, drain and gate, said drain coupled to said second output terminal (22) and said gate coupled to said source of said first MOSFET;
   a first current source means coupled to said source (56) of said first MOSFET for causing a substantially constant drain current to flow in said first MOSFET;
   a second current source means coupled to said source (58) of said second MOSFET for causing a substantially constant drain current to flow through said second MOSFET.

* * * * *